(12) United States Patent
Shen et al.

(10) Patent No.: US 11,174,385 B2
(45) Date of Patent: Nov. 16, 2021

(54) RESIN COMPOSITION AND ARTICLE MADE THEREFROM

(71) Applicant: Elite Material Co., Ltd., Taoyuan (TW)

(72) Inventors: Chenyu Shen, Kunshan (CN); Yan Zhang, Kunshan (CN); Jue Tan, Kunshan (CN); Rongtao Wang, Kunshan (CN)

(73) Assignee: Elite Material Co., Ltd., Taoyuan (TW)

( * ) Notice: Subject to any disclaimer, the term of this patent is extended or adjusted under 35 U.S.C. 154(b) by 164 days.

(21) Appl. No.: 16/550,844

(22) Filed: Aug. 26, 2019

(65) Prior Publication Data

US 2021/0032463 A1  Feb. 4, 2021

(30) Foreign Application Priority Data

Jul. 30, 2019 (CN) .......................... 201910695907.7

(51) Int. Cl.
| | |
|---|---|
| *C08L 71/12* | (2006.01) |
| *C08J 5/24* | (2006.01) |
| *C08L 79/08* | (2006.01) |
| *B32B 5/02* | (2006.01) |
| *B32B 5/26* | (2006.01) |
| *B32B 15/14* | (2006.01) |
| *B32B 15/20* | (2006.01) |
| *H05K 1/03* | (2006.01) |

(52) U.S. Cl.
CPC .............. *C08L 71/126* (2013.01); *B32B 5/02* (2013.01); *B32B 5/26* (2013.01); *B32B 15/14* (2013.01); *B32B 15/20* (2013.01); *C08J 5/24* (2013.01); *C08L 79/08* (2013.01); *H05K 1/0353* (2013.01); *B32B 2250/05* (2013.01); *B32B 2260/021* (2013.01); *B32B 2260/046* (2013.01); *B32B 2262/101* (2013.01); *C08J 2371/12* (2013.01); *C08J 2379/08* (2013.01); *C08J 2471/12* (2013.01); *C08J 2479/08* (2013.01)

(58) Field of Classification Search
CPC ........... C08L 71/126; C08L 79/08; C08J 5/24; H05K 1/0353; B32B 5/02; B32B 5/26; B32B 15/14; B32B 15/20
USPC ....................................... 428/195.1
See application file for complete search history.

(56) References Cited

U.S. PATENT DOCUMENTS

| | | | | |
|---|---|---|---|---|
| 6,552,130 | B1 * | 4/2003 | Makino ..................... | C08F 4/00 525/221 |
| 2014/0353549 | A1 * | 12/2014 | Mayo ..................... | C08K 5/005 252/183.12 |
| 2016/0021740 | A1 * | 1/2016 | Li ............................ | B32B 5/00 428/195.1 |
| 2016/0185904 | A1 | 6/2016 | Gao et al. | |

FOREIGN PATENT DOCUMENTS

CN      107011657 A  *  8/2017

OTHER PUBLICATIONS

Machine_English_translation_CN_107011657_A; Li, Hao, et al.; High-toughness bismaleimide resin as well as preparation method and application thereof; Aug. 4, 2017; EPO; whole document (Year: 2017).*

* cited by examiner

*Primary Examiner* — Tahseen Khan
(74) *Attorney, Agent, or Firm* — Muncy, Geissler, Olds & Lowe, P.C.

(57) ABSTRACT

A resin composition comprises: an unsaturated bond-containing polyphenylene ether resin; a maleimide resin of Formula (1); and a compound of Formula (2) or Formula (3). The resin composition may be used to make various articles, such as a prepreg, a resin film, a laminate or a printed circuit board, and at least one of the following improvements can be achieved, including prepreg viscosity variation ratio, stickiness resistance, amount of void after lamination, multilayer board thermal resistance, glass transition temperature, ratio of thermal expansion, copper foil peeling strength and dissipation factor.

16 Claims, No Drawings

RESIN COMPOSITION AND ARTICLE MADE THEREFROM

CROSS-REFERENCE TO RELATED APPLICATION

This application claims the priority benefits of China Patent Application No. 201910695907.7, filed on Jul. 30, 2019, the entirety of which is hereby incorporated by reference herein and made a part of this specification.

BACKGROUND

1. Field of the Disclosure

The present disclosure relates to a resin composition and more particularly to a resin composition useful for preparing a prepreg, a resin film, a laminate or a printed circuit board.

2. Description of Related Art

With the rapid advancement of electronic technology, information processing in mobile communication, servers, cloud storage and other electronic products has been incessantly directed toward high frequency signal transmission and high speed digitalization, and low dielectric resin material has become the mainstream for the development of laminates for high speed data transmission in order to satisfy the demands of high speed information transmission. The major requirements of resin materials such as copper-clad laminates include several aspects such as low dissipation factor (Df), high reliability, high thermal resistance and high dimensional stability. Therefore, there is a need for developing materials suitable for a printed circuit board (PCB) with overall better performances.

SUMMARY

To overcome the problems of prior arts, particularly one or more above-mentioned technical problems facing conventional materials, it is a primary object of the present disclosure to provide a resin composition and an article made therefrom which may overcome at least one of the above-mentioned technical problems.

To achieve the above-mentioned object, the present disclosure provides a resin composition, comprising: an unsaturated bond-containing polyphenylene ether resin; a maleimide resin of Formula (1); and a compound of Formula (2) or Formula (3):

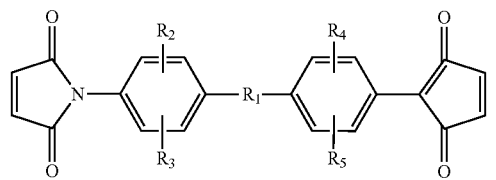

Formula (1)

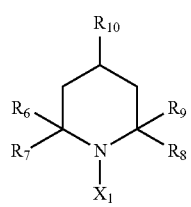

Formula (2)

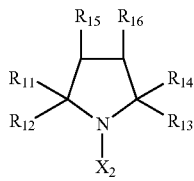

Formula (3)

wherein:

in Formula (1), $R_1$ is a covalent bond, $—CH_2—$, $—CH(CH_3)—$, $—C(CH_3)_2—$, $—O—$, $—S—$, $—SO_2—$ or a carbonyl group, $R_2$ to $R_5$ each independently represent a hydrogen atom or a $C_1$-$C_5$ alkyl group, and $R_2$ to $R_5$ are not a hydrogen atom at the same time;

in Formula (2), $X_1$ is an oxygen radical or a hydroxyl group, $R_6$ to $R_9$ each independently represent a hydrogen atom or a $C_1$-$C_5$ alkyl group, $R_6$ to $R_9$ are not a hydrogen atom at the same time, and $R_{10}$ is a hydrogen atom, a methyl group, an amino group, a hydroxyl group, a carbonyl group or a carboxyl group; and in Formula (3), $X_2$ is an oxygen radical or a hydroxyl group, $R_{11}$ to $R_{14}$ each independently represent a hydrogen atom or a $C_1$-$C_5$ alkyl group, $R_{11}$ to $R_{14}$ are not a hydrogen atom at the same time, and $R_{15}$ and $R_{16}$ each independently represent a hydrogen atom, a methyl group, an amino group, a hydroxyl group, a carbonyl group or a carboxyl group or $R_{15}$ and $R_{16}$ together define a benzene ring structure.

In one embodiment, the resin composition comprises: 20 to 150 parts by weight of the unsaturated bond-containing polyphenylene ether resin; 5 to 40 parts by weight of the maleimide resin of Formula (1); and 0.001 to 5 parts by weight of the compound of Formula (2) or Formula (3).

For example, in one embodiment, the resin composition comprises: 20 to 150 parts by weight of the unsaturated bond-containing polyphenylene ether resin; 5 to 40 parts by weight of the maleimide resin of Formula (1); and 0.001 to 2 parts by weight of the compound of Formula (2) or Formula (3).

In one embodiment, the unsaturated bond-containing polyphenylene ether resin comprises a vinylbenzyl-containing polyphenylene ether resin, a methacrylate-containing polyphenylene ether resin, an allyl-containing polyphenylene ether resin, a vinylbenzyl-modified bisphenol A polyphenylene ether resin, a chain-extended vinyl-containing polyphenylene ether resin or a combination thereof.

Unless otherwise specified, the unsaturated bond-containing polyphenylene ether resin is construed as including its modification. Examples of the modification described above may comprise, but not limited to, a product derived from an unsaturated bond-containing polyphenylene ether resin with its reactive functional group modified, a product derived from a prepolymerization reaction of an unsaturated bond-containing polyphenylene ether resin and other resins, a product derived from a crosslinking reaction of an unsaturated bond-containing polyphenylene ether resin and other resins, a product derived from homopolymerizing an unsaturated bond-containing polyphenylene ether resin, a product derived from copolymerizing an unsaturated bond-containing polyphenylene ether resin and another different unsaturated bond-containing polyphenylene ether resin, etc.

In one embodiment, the maleimide resin of Formula (1) comprises a monomer of any one of Formula (4) to Formula (8), a polymer thereof or a combination thereof:

Formula (4)

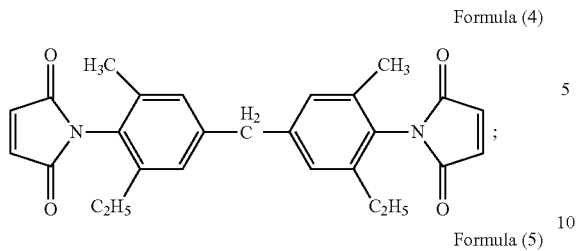

Formula (5)

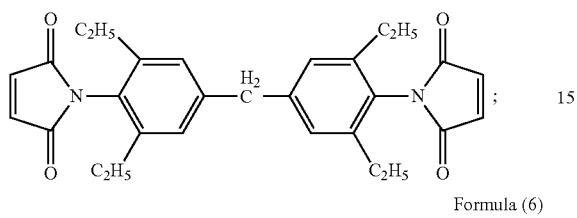

Formula (6)

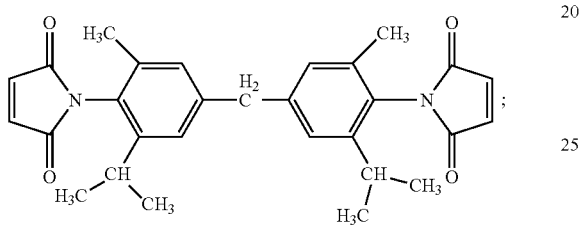

Formula (7)

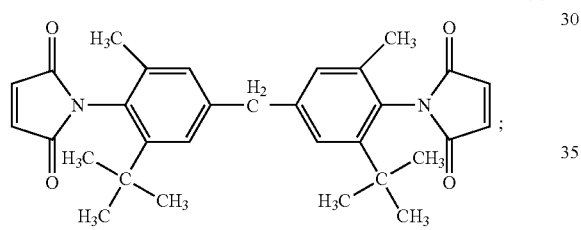

Formula (8)

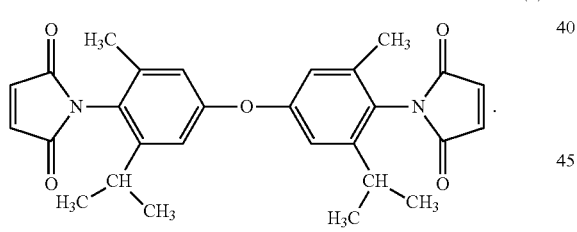

For example, the maleimide resin of Formula (4) comprises, but not limited to, a product such as BMI-5100 available from Daiwakasei Industry Co., Ltd., or a product such as BMI-70 available from K.I Chemical Industry Co., Ltd.

In one embodiment, the compound of Formula (2) comprises a compound of any one of Formula (9) to Formula (13) or a combination thereof:

Formula (9)

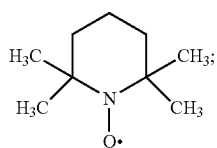

Formula (10)

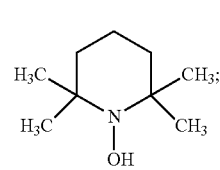

Formula (11)

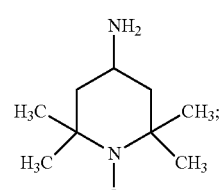

Formula (12)

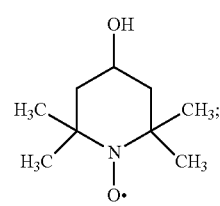

Formula (13)

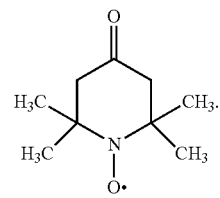

In one embodiment, the compound of Formula (3) comprises a compound of any one of Formula (14) to Formula (17) or a combination thereof:

Formula (14)

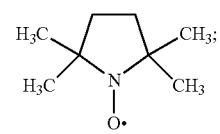

Formula (15)

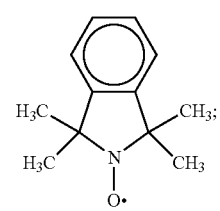

Formula (16)

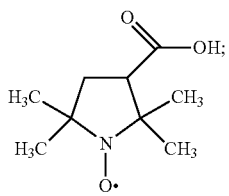

Formula (17)

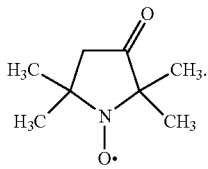

In addition, in one embodiment, the resin composition may further optionally comprise: an epoxy resin, a cyanate ester resin, a small molecule vinyl compound, an acrylate, a phenolic resin, a benzoxazine resin, a styrene maleic anhydride, a polyolefin, a polyester resin, an amine curing agent, a polyamide resin, a polyimide resin or a combination thereof.

In addition, in one embodiment, the resin composition may further optionally comprise: flame retardant, inorganic filler, curing accelerator, solvent, silane coupling agent, coloring agent, toughening agent or a combination thereof.

In one embodiment, in the presence of a solvent, the resin composition may be fully dissolved at 5-35° C.

Another main object of the present disclosure is to provide an article made from the aforesaid resin composition, comprising a prepreg, a resin film, a laminate or a printed circuit board.

In one embodiment, articles made from the resin composition disclosed herein have one, more or all of the following properties:
- a prepreg viscosity variation ratio of less than or equal to 10%;
- absence of stickiness between two adjacent prepreg surfaces;
- absence of void after lamination;
- no delamination after subjecting the article to a multilayer board thermal resistance test by reference to IPC-TM-650 2.4.13.1;
- a glass transition temperature as measured by reference to IPC-TM-650 2.4.24.4 of greater than or equal to 230° C.;
- a ratio of thermal expansion as measured by reference to IPC-TM-650 2.4.24.5 of less than or equal to 2.0%.
- a copper foil peeling strength as measured by reference to IPC-TM-650 2.4.8 of greater than or equal to 3.7 lb/in; and
- a dissipation factor at 10 GHz as measured by reference to JIS C2565 of less than or equal to 0.0038.

DESCRIPTION OF THE EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, the term "comprises," "comprising," "includes," "including," "has," "having" or any other variant thereof is construed as an open-ended transitional phrase intended to cover a non-exclusive inclusion. For example, a composition or article of manufacture that comprises a list of elements is not necessarily limited to only those elements but may include other elements not expressly listed but inherent to such composition or article of manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Similarly, a range of "between 1 and 8" should be understood as explicitly disclosing all ranges such as 1 to 8, 1 to 7, 2 to 8, 2 to 6, 3 to 6, 4 to 8, 3 to 8 and so on and encompassing the end points of the ranges. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being "selected from a group consisting of $X_1$, $X_2$ and $X_3$" and Y is described as being "selected from a group consisting of $Y_1$, $Y_2$ and $Y_3$," the disclosure shall be interpreted as any combination of X is $X_1$ or $X_2$ or $X_3$ and Y is $Y_1$ or $Y_2$ or $Y_3$.

The following embodiments and examples are illustrative in nature and are not intended to limit the present disclosure and its application. In addition, the present disclosure is not bound by any theory described in the background and summary above or the following embodiments or examples.

As described above, a main object of the present disclosure is to provide a resin composition, comprising: an unsaturated bond-containing polyphenylene ether resin; a maleimide resin of Formula (1); and a compound of Formula (2) or Formula (3):

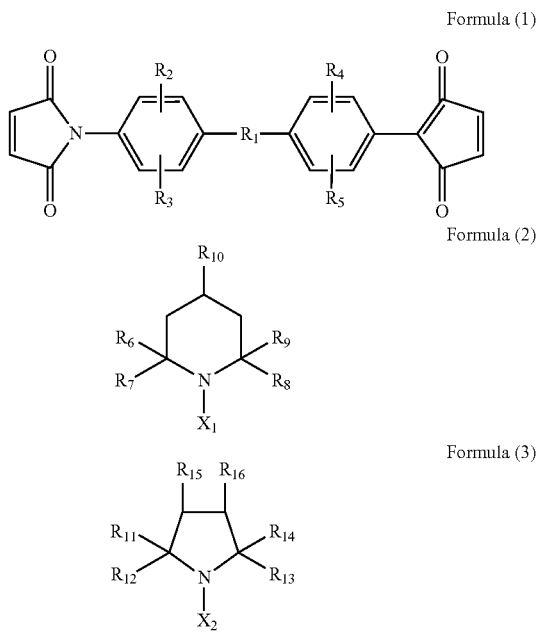

wherein:
in Formula (1), $R_1$ is a covalent bond, $-CH_2-$, $-CH(CH_3)-$, $-C(CH_3)_2-$, $-O-$, $-S-$, $-SO_2-$ or a carbonyl group, $R_2$ to $R_5$ each independently represent a hydrogen atom or a $C_1$-$C_5$ alkyl group, and $R_2$ to $R_5$ are not a hydrogen atom at the same time;
in Formula (2), $X_1$ is an oxygen radical or a hydroxyl group, $R_6$ to $R_9$ each independently represent a hydrogen atom or a $C_1$-$C_5$ alkyl group, $R_6$ to $R_9$ are not a hydrogen atom at the same time, and $R_{10}$ is a hydrogen atom, a methyl group, an amino group, a hydroxyl group, a carbonyl group or a carboxyl group; and
in Formula (3), $X_2$ is an oxygen radical or a hydroxyl group, $R_{11}$ to $R_{14}$ each independently represent a hydrogen atom or a $C_1$-$C_5$ alkyl group, $R_{11}$ to $R_{14}$ are not a hydrogen atom at the same time, and $R_{15}$ and $R_{16}$ each independently represent a hydrogen atom, a methyl group, an amino group, a hydroxyl group, a carbonyl group or a carboxyl group or $R_{15}$ and $R_{16}$ together define a benzene ring structure.

As used herein, "unsaturated bond" refers to the presence of an ethylenic carbon-carbon double bond (C=C) or a functional group derived therefrom in a compound. Therefore, examples of "unsaturated bond" may include, but not limited to, a structure containing a vinyl group, an allyl group, a vinylbenzyl group, a methacrylate or the like. Unless otherwise specified, the position of the aforesaid functional group is not particularly limited and may be located at the terminal of a long chain structure. In other words, the unsaturated bond-containing polyphenylene ether resin described herein represents a polyphenylene ether resin containing an unsaturated bond, examples including but not limited to a polyphenylene ether resin containing a vinyl group, an allyl group, a vinylbenzyl group, a methacrylate or the like.

In one embodiment, the unsaturated bond-containing polyphenylene ether resin comprises a vinylbenzyl-containing polyphenylene ether resin, a methacrylate-containing polyphenylene ether resin, an allyl-containing polyphenylene ether resin, a vinylbenzyl-modified bisphenol A polyphenylene ether resin, a chain-extended vinyl-containing polyphenylene ether resin or a combination thereof.

For example, the unsaturated bond-containing polyphenylene ether resin may be a vinylbenzyl-containing polyphenylene ether resin with a number average molecular weight of about 1200 (such as OPE-2st 1200, available from Mitsubishi Gas Chemical Co., Inc.), a vinylbenzyl-containing polyphenylene ether resin with a number average molecular weight of about 2200 (such as OPE-2st 2200, available from Mitsubishi Gas Chemical Co., Inc.), a methacrylate-containing polyphenylene ether resin with a number average molecular weight of about 1900 to 2300 (such as SA-9000, available from Sabic), a vinylbenzyl-modified bisphenol A polyphenylene ether resin with a number average molecular weight of about 2400 to 2800, a chain-extended vinyl-containing polyphenylene ether resin with a number average molecular weight of about 2200 to 3000, or a combination thereof. The chain-extended vinyl-containing polyphenylene ether resin may include various polyphenylene ether resins disclosed in the US Patent Application Publication No. 2016/0185904 A1, all of which are incorporated herein by reference in their entirety.

In addition, for example, the unsaturated bond-containing polyphenylene ether resin may comprise a structure of Formula (A):

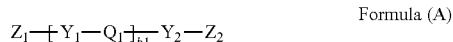

Formula (A)

wherein b1 is a natural number of 0 to 2;

$Q_1$ comprises a structure of any one of Formula (A-1) to Formula (A-3):

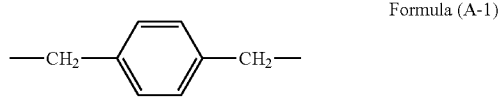

Formula (A-1)

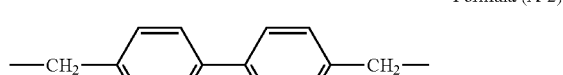

Formula (A-2)

Formula (A-3)

$Y_1$ and $Y_2$ independently comprise a structure of Formula (A-4):

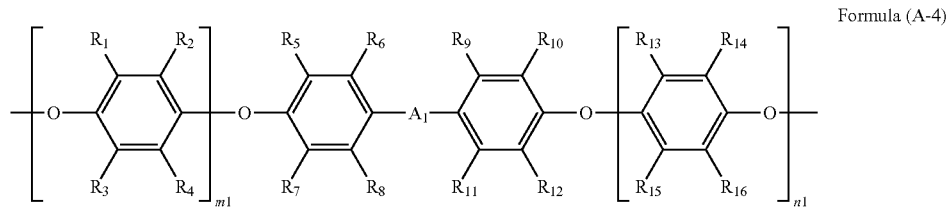

Formula (A-4)

In Formula (A-4), m1 and n1 independently represent an integer of 1 to 15, such as 1, 5, 10 or 15; $R_1$ to $R_{16}$ are independently selected from H, —$CH_3$ and a halogen atom (e.g., chlorine, bromine, or iodine); $A_1$ is selected from a covalent bond, —$CH_2$—, —$CH(CH_3)$—, —$C(CH_3)_2$—, —O—, —S—, —$SO_2$— and a carbonyl group;

$Z_1$ and $Z_2$ independently comprise a structure of Formula (A-5):

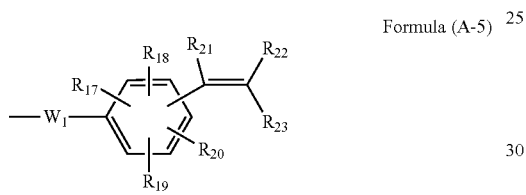

Formula (A-5)

In Formula (A-5), $R_{17}$ to $R_{23}$ are individually selected from H, —$CH_3$ or a halogen atom, and $W_1$ is a $C_1$-$C_3$ bivalent aliphatic group, such as methylene, ethylene, or propylene.

For example, the unsaturated bond-containing polyphenylene ether resin may comprise a structure below:

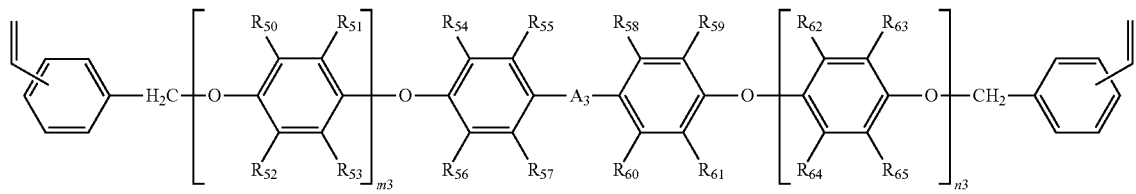

wherein $m_3$ and $n_3$ independently represent an integer of 1 to 15; $R_{50}$ to $R_{65}$ are independently selected from H, —$CH_3$ and a halogen atom; and $A_3$ is selected from a covalent bond, —$CH_2$—, —$CH(CH_3)$—, —$C(CH_3)_2$—, —O—, —S—, —$SO_2$— and a carbonyl group.

In addition, for example, the unsaturated bond-containing polyphenylene ether resin may comprise a structure of Formula (B):

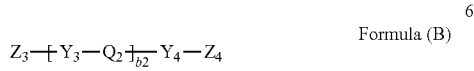

Formula (B)

wherein b2 is a natural number of 0 to 8;

$Q_2$ comprises a structure of any one of Formula (B-1) to Formula (B-3) or a combination thereof:

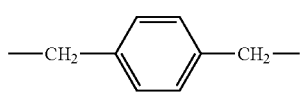

Formula (B-1)

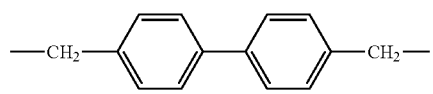

Formula (B-2)

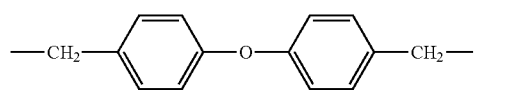

Formula (B-3)

$Y_3$ and $Y_4$ independently comprise a structure of Formula (B-4):

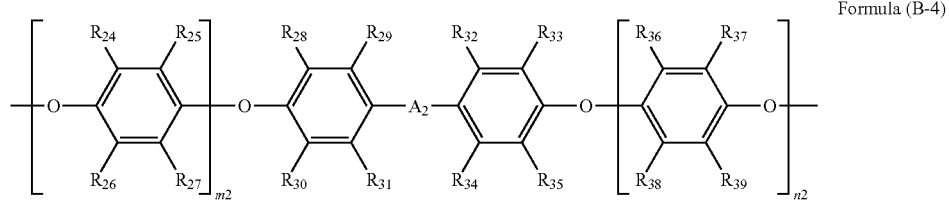

Formula (B-4)

wherein m2 and n2 independently represent an integer of 1 to 30, such as 1, 5, 10, 15, 20, 25 or 30; $R_{24}$ to $R_{39}$ are independently selected from H, —$CH_3$ and a halogen atom (e.g., chlorine, bromine, or iodine); $A_2$ is selected from a covalent bond, —$CH_2$—, —CH($CH_3$)—, —C($CH_3$)$_2$—, —O—, —S—, —$SO_2$— and a carbonyl group;

$Z_3$ and $Z_4$ independently comprise a structure of Formula (B-5), Formula (B-6) or Formula (B-7):

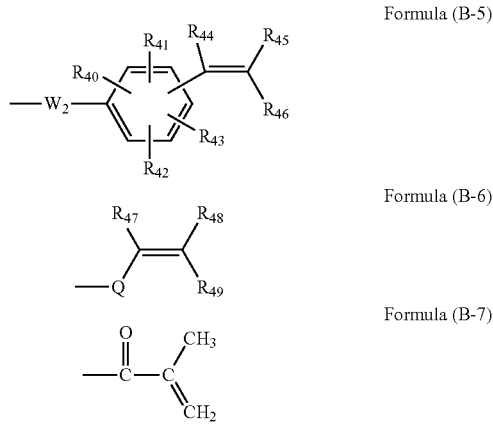

Formula (B-5)

Formula (B-6)

Formula (B-7)

wherein $R_{40}$ to $R_{49}$ are individually selected from H, —$CH_3$ or a halogen atom, and $W_2$ and Q are individually a $C_1$-$C_3$ bivalent aliphatic group (e.g., methylene, ethylene, or propylene).

In the resin composition of the present disclosure, the maleimide resin of Formula (1) may be various diphenyl bismaleimides having at least one substituted benzene ring, such as 3,3-dimethyl-5,5'-diethyl-4,4'-diphenylmethane bismaleimide and 3,3-dimethyl-5,5'-diethyl-4,4'-diphenyl ether bismaleimide, but not limited thereto. Examples include but are not limited to a monomer of any one of Formula (4) to Formula (8), a polymer thereof or a combination thereof.

In the resin composition of the present disclosure, the compound of Formula (2) preferably comprises a compound of any one of Formula (9) to Formula (12) or a combination thereof, but not limited thereto. Unless otherwise specified, in Formula (2), the oxygen radical at the position $X_1$ and the hydroxyl group at the position $X_1$ are chemically equivalent. For example, the structure of Formula (9) and the structure of Formula (10) are equivalent to each other; that is, the structure of Formula (10) may be present as the structure of Formula (9), and the structure of Formula (9) may be present as the structure of Formula (10).

In another aspect, in the resin composition of the present disclosure, the compound of Formula (3) preferably comprises a compound of any one of Formula (13) to Formula (15) or a combination thereof, but not limited thereto. Similarly, unless otherwise specified, in Formula (3), the oxygen radical at the position $X_2$ and the hydroxyl group at the position $X_2$ are chemically equivalent.

In other words, as used herein, unless otherwise specified, to the compound of Formula (2) or the compound of Formula (3), any disclosure of embodiment or chemical structure of $X_1$ or $X_2$ being an oxygen radical is considered as the disclosure of embodiment or chemical structure of $X_1$ or $X_2$ being a hydroxyl group. For example, whenever the structure of Formula (9) is disclosed herein, it is construed as the disclosure of the structure of Formula (10), vice versa.

The amount of each component used in the resin composition disclosed herein is not particularly limited. For example, the unsaturated bond-containing polyphenylene ether resin may range from 20 to 150 parts by weight, the maleimide resin of Formula (1) may range from 5 to 40 parts by weight, the compound of Formula (2) may range from 0.001 to 5 parts by weight, and the compound of Formula (3) may range from 0.001 to 5 parts by weight.

In one embodiment, the resin composition disclosed herein may further optionally comprise: an epoxy resin, a cyanate ester resin, a small molecule vinyl compound, an acrylate, a phenolic resin, a benzoxazine resin, a styrene maleic anhydride, a polyolefin, a polyester resin, an amine curing agent, a polyamide resin, a polyimide resin or a combination thereof.

For example, the epoxy resin may be any epoxy resins known in the field to which this disclosure pertains, including but not limited to bisphenol A epoxy resin, bisphenol F epoxy resin, bisphenol S epoxy resin, bisphenol AD epoxy resin, phenol novolac epoxy resin, trifunctional epoxy resin, tetrafunctional epoxy resin, multifunctional novolac epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin, or a combination thereof. The phenol novolac epoxy resin may be bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin, wherein the phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin; the DOPO-HQ epoxy resin may be any one or more selected from DOPO-HQ-containing phenolic novolac epoxy resin, DOPO-HQ-containing cresol novolac epoxy resin and DOPO-HQ-containing bisphenol-A novolac epoxy resin.

For example, the cyanate ester resin may include any one or more cyanate ester resins useful for preparing a prepreg, a resin film, a laminate or a printed circuit board, such as a compound having an Ar—O—CN structure, wherein Ar may be a substituted or unsubstituted aromatic group. Examples include but are not limited to novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin, fluorene cyanate ester resin or a combination thereof. The novolac cyanate ester resin may be bisphenol A novolac cyanate ester resin, bisphenol F novolac cyanate ester resin or a combination thereof. For example, the cyanate ester resin may be available under the tradename Primaset PT-15, PT-30S, PT-60S, BA-200, BA-230S, BA-3000S, BTP-2500, BTP-6020S, DT-4000, DT-7000, ULL950S, HTL-300, CE-320, LVT-50, or LeCy sold by Lonza.

For example, the small molecule vinyl-containing compound as used herein refers to a vinyl-containing compound with a molecular weight of less than or equal to 1000, preferably between 100 and 900 and more preferably between 100 and 800. According to the present disclosure, the small molecule vinyl compound may include, but not limited to, divinylbenzene (DVB), bis(vinylbenzyl) ether (BVBE), bis(vinylphenyl)ethane (BVPE), triallyl isocyanurate (TAIC), triallyl cyanurate (TAC), 1,2,4-trivinyl cyclohexane (TVCH) or a combination thereof.

For example, the acrylate may include, but not limited to, tricyclodecane di(meth)acrylate, tri(meth)acrylate, 1,1'-[(octahydro-4,7-methano-1H-indene-5,6-diyl) bis(methylene)] ester (e.g., SR833S, available from Sartomer) or a combination thereof.

For example, the phenolic resin may comprise but not limited to mono-functional, bifunctional or multifunctional phenolic resin, comprising phenolic resin of a resin composition conventionally used for making prepregs, such as phenoxy resin, phenol novolac resin, etc.

For example, the benzoxazine resin includes, but not limited to, bisphenol A benzoxazine resin, bisphenol F benzoxazine resin, phenolphthalein benzoxazine resin, dicyclopentadiene benzoxazine resin, phosphorus-containing benzoxazine resin, oxydianiline benzoxazine resin, or unsaturated bond-containing benzoxazine resin, such as but not limited to LZ-8270, LZ-8280, LZ-8290 or LZ-8298 available from Huntsman, HFB-2006M available from Showa High Polymer, or KZH-5031 available from Kolon Industries Inc.

For example, in the styrene maleic anhydride, the ratio of styrene (S) to maleic anhydride (MA) may be for example 1/1, 2/1, 3/1, 4/1, 6/1, 8/1 or 12/1, examples including styrene maleic anhydride copolymers such as SMA-1000, SMA-2000, SMA-3000, EF-30, EF-40, EF-60 and EF-80 available from Cray Valley, or styrene maleic anhydride copolymers such as C400, C500, C700 and C900 available from Polyscope.

For example, examples of the polyolefin include but are not limited to styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, hydrogenated styrene-butadiene-divinylbenzene terpolymer, polybutadiene (homopolymer of butadiene), maleic anhydride-butadiene copolymer, methyl styrene copolymer or a combination thereof.

For example, the polyester resin may be prepared by esterification of dicarboxylic aromatic compounds with dihydroxyl aromatic compounds. Examples of the polyester resin include, but not limited to, HPC-8000, HPC-8150 or HPC-8200 available from D.I.C. Corporation.

For example, the amine curing agent may include, but not limited to, any one or a combination of diamino diphenyl sulfone, diamino diphenyl methane, diamino diphenyl ether, diamino diphenyl sulfide and dicyandiamide.

For example, the polyamide resin may be any polyamide resin known in the field to which this disclosure pertains, including but not limited to various commercially available polyamide resin products.

For example, the polyimide resin may be any polyimide resin known in the field to which this disclosure pertains, including but not limited to various commercially available polyimide resin products.

In one embodiment, the resin composition disclosed herein may optionally further comprise: flame retardant, inorganic filler, curing accelerator, solvent, silane coupling agent, coloring agent, toughening agent or a combination thereof.

For example, the flame retardant used herein may be any one or more flame retardants useful for preparing a prepreg, a resin film, a laminate or a printed circuit board, examples including but not limited to a phosphorus-containing flame retardant, preferably comprising ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, DPPO (diphenylphosphine oxide) and its derivatives or resins, melamine cyanurate, tri-hydroxy ethyl isocyanurate, aluminium phosphate (e.g., commercially available OP-930 and OP-935), and a combination thereof.

For example, the flame retardant may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN) and a DOPO-containing epoxy resin, wherein DOPO-PN is a DOPO phenol novolac compound, and DOPO-BPN may be a DOPO-containing bisphenol novolac compound, such as DOPO-BPAN (DOPO-bisphenol A novolac), DOPO-BPFN (DOPO-bisphenol F novolac) or DOPO-BPSN (DOPO-bisphenol S novolac).

For example, the inorganic filler may be any one or more inorganic fillers used for preparing a prepreg, a resin film, a laminate or a printed circuit board; examples of the inorganic filler include but are not limited to silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (A100H), calcined talc, talc, silicon nitride and calcined kaolin. Moreover, the inorganic filler can be spherical, fibrous, plate-like, particulate, sheet-like or whisker-like in shape and can be optionally pretreated by a silane coupling agent.

For example, the curing accelerator (including curing initiator) may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethyl amino pyridine (DMAP). The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl) benzene or a combination thereof.

For example, the solvent is not particularly limited and may be any solvent suitable for dissolving the resin composition disclosed herein, example including, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof. In one embodiment, after being dissolved in a solvent, the resin composition of the present disclosure has the advantage of high solubility; for example, in the presence of a solvent, resins of the resin composition may be fully dissolved at 5-35° C. (i.e., the result of the resin solubility test is "clear").

For example, the silane coupling agent may comprise silane (such as but not limited to siloxane) and may be further categorized according to the functional groups into amino silane, epoxide silane, vinyl silane, acrylate silane, methacrylate silane, hydroxyl silane, isocyanate silane, methacryloxy silane and acryloxy silane.

For example, the coloring agent may comprise but not limited to dye or pigment.

As used herein, the purpose of adding toughening agent is to improve the toughness of the resin composition. For example, the toughening agent may comprise, but not limited to, rubber resin, carboxyl-terminated butadiene acrylonitrile rubber (CTBN rubber), core-shell rubber, or a combination thereof.

The resin compositions of various embodiments may be used for making different articles, including but not limited to a prepreg, a resin film, a laminate or a printed circuit board.

For example, the resin composition according to each of the various embodiments may be used to make a prepreg, which has a reinforcement material and a layered structure (e.g., insulation layer) formed thereon, wherein the layered structure is made by heating the resin composition to a semi-cured state (B-Stage) at a temperature for example between 120° C. and 160° C. For example, the reinforcement material may be any one of a fiber material, woven fabric, and non-woven fabric, and the woven fabric preferably comprises fiberglass fabrics. Types of fiberglass fabrics are not particularly limited and may be any commercial fiberglass fabric used for various printed circuit boards, such as E-glass fabric, D-glass fabric, S-glass fabric, T-glass fabric, L-glass fabric or Q-glass fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pretreated by a silane coupling agent. The prepreg may be further heated and cured to the C-stage to form an insulation layer.

For example, the resin composition according to each of the various embodiments may be coated on a liquid crystal resin film, a polyester (PET) film, a polyimide (PI) film, a copper foil or a resin-coated copper (RCC), followed by baking and heating to the semi-cured state (B-Stage) to obtain a resin film.

For example, resin compositions of various embodiments of the present disclosure may be made into a laminate, such as a copper-clad laminate, which comprises two copper foils and an insulation layer disposed between the copper foils, wherein the insulation layer is made by curing the resin compositions at high temperature and high pressure, a suitable curing temperature being for example between 190° C. and 220° C. and preferably between 200° C. and 215° C. and a suitable curing time being 90 to 180 minutes and preferably 110 to 150 minutes. The insulation layer may be obtained by curing the aforesaid prepreg or resin film. In one preferred embodiment, the laminate is a copper-clad laminate.

In one embodiment, the laminate may be further processed by trace formation processes to provide a printed circuit board.

Articles made from the resin composition disclosed herein achieves at least one or more of the properties including low prepreg viscosity variation ratio, high prepreg stickiness resistance, less void after lamination, high multi-layer board thermal resistance, high glass transition temperature, low ratio of thermal expansion, high copper foil peeling strength, and low dissipation factor.

For example, the resin composition according to the present disclosure may achieve one, more or all of the following properties:
  a prepreg viscosity variation ratio of less than or equal to 10%, such as between 1% and 10%;
  absence of stickiness between two adjacent prepreg surfaces;
  absence of void after lamination (i.e., the amount of void after lamination is zero);
  no delamination after subjecting the article to a multi-layer board thermal resistance test by reference to IPC-TM-650 2.4.13.1;
  a glass transition temperature as measured by reference to IPC-TM-650 2.4.24.4 of greater than or equal to 230° C., such as between 230° C. and 270° C., or between 233° C. and 265° C.;
  a ratio of thermal expansion as measured by reference to IPC-TM-650 2.4.24.5 of less than or equal to 2.0%, such as between 1.2% and 2.0%, or between 1.2% and 1.8%;
  a copper foil peeling strength as measured by reference to IPC-TM-650 2.4.8 of greater than or equal to 3.7 lb/in, such as between 3.7 lb/in and 4.6 lb/in or between 4.0 lb/in and 4.6 lb/in; and
  a dissipation factor at 10 GHz as measured by reference to JIS C2565 of less than or equal to 0.0038, such as between 0.0033 and 0.0038.

Materials and reagents used in Examples and Comparative Examples disclosed herein are listed below:

OPE-2st 1200: bis(vinylbenzyl)-terminated polyphenylene ether resin with a number average molecular weight (Mn) of about 1200, available from Mitsubishi Gas Chemical Co., Inc.

OPE-2st 2200: bis(vinylbenzyl)-terminated polyphenylene ether resin with a number average molecular weight (Mn) of about 2200, available from Mitsubishi Gas Chemical Co., Inc.

SA-9000: dimethacrylate-terminated polyphenylene ether resin with a number average molecular weight (Mn) of about 1900 to 2300, available from Sabic.

BMI-70: 3,3-dimethyl-5,5'-diethyl-4,4'-diphenylmethane bismaleimide, available from K.I Chemical Industry Co., Ltd.

Compound E: bismaleimide of Formula (6), commercially available.

Compound A: compound of Formula (9), available from MERCK.

Compound B: compound of Formula (11), available from MERCK.

Compound C: compound of Formula (14), available from MERCK.

Compound D: compound of Formula (15), available from MERCK.

4-t-butylcatechol: available from DIC corporation.

1,4-benzoquinone: available from Sigma-Aldrich.

1,1-diphenyl-2-picrylhydrazyl radical: available from Aladdin Industrial Corporation.

OPE-2Gly: epoxy-terminated polyphenylene ether resin, available from Mitsubishi Gas Chemical Co., Inc.

SA-90: dihydroxyl-terminated polyphenylene ether resin with a number average molecular weight (Mn) of about 1700 to 1900, available from Sabic.

SA-120: monohydroxyl-terminated polyphenylene ether resin with a number average molecular weight (Mn) of about 2300 to 2400, available from Sabic.

BMI-1000: 4,4'-diphenylmethane bismaleimide, available from Daiwakasei Industry Co., Ltd.

BMI-3000: m-phenylene bismaleimide resin, available from Daiwakasei Industry Co., Ltd.

BMI-7000: 4-methyl-1,3-phenylene bismaleimide, available from Daiwakasei Industry Co., Ltd.

Ricon 100: styrene-butadiene copolymer, available from Cray Valley.

SC-2500-SVJ: spherical silica pre-treated by silane coupling agent, available from Admatechs.

DCP: dicumyl peroxide, available from Kingyorker Enterprise Co., Ltd.

Mixture of toluene and methyl ethyl ketone (weight ratio of 1:4): prepared by Applicant, wherein the toluene is available from Chambeco Group and the methyl ethyl ketone is commercially available.

Samples (specimens) were prepared as described below and tested and analyzed under specified conditions below.

1. Prepreg: Resin composition from each Example or each Comparative Example (in part by weight) was separately well-mixed to form a varnish, wherein the "proper amount" of the mixture of toluene and methyl ethyl ketone (weight ratio of 1:4) as the solvent refers to an amount of the mixture capable of resulting in a solid content of 60% of the resin composition in the varnish. Then the varnish was loaded to an impregnation tank; a fiberglass fabric (e.g., 2116 E-glass fiber fabric, available from Asahi) was impregnated into the impregnation tank to adhere the resin composition onto the fiberglass fabric, followed by heating and baking at 140° C. for about 4 minutes to obtain a prepreg.

2. Copper-containing laminate (a.k.a. copper-clad laminate, 5-ply, formed by lamination of five prepregs): Two 18 μm HVLP (hyper very low profile) copper foils and five prepregs obtained from 2116 E-glass fiber fabrics impregnated with each Example or Comparative Example and having a resin content of about 55% were prepared and stacked in the order of one copper foil, five prepregs and one copper foil, followed by lamination under vacuum at 30 kgf/cm$^2$ and 200° C. for 120 minutes to form a copper-containing laminate. Insulation layers were formed by laminating five sheets of prepreg between the two copper foils, and the resin content of the insulation layers is about 55%.

3. Copper-containing laminate (a.k.a. copper-clad laminate, 2-ply, formed by lamination of two prepregs): Two 18 μm HVLP (hyper very low profile) copper foils and two prepregs obtained from 1080 E-glass fiber fabrics impregnated with each Example or Comparative Example and having a resin content of about 70% were prepared and stacked in the order of one copper foil, two prepregs and one copper foil, followed by lamination under vacuum at 30 kgf/cm$^2$ and 200° C. for 120 minutes to form a copper-containing laminate. Insulation layers were formed by laminating two sheets of prepreg between the two copper foils, and the resin content of the insulation layers is about 70%.

4. Copper-free laminate (5-ply, formed by lamination of five prepregs): Each aforesaid copper-containing laminate (5-ply) was etched to remove the two copper foils to obtain a copper-free laminate (5-ply) formed by laminating five sheets of prepreg and having a resin content of about 55%.

5. Copper-free laminate (2-ply, formed by lamination of two prepregs): Each aforesaid copper-containing laminate (2-ply) was etched to remove the two copper foils to obtain a copper-free laminate (2-ply) formed by laminating two sheets of prepreg and having a resin content of about 70%.

For each sample, test items and test methods are described below.

Resin Solubility

At 5-35° C., the resin composition from each Example or each Comparative Example was used to prepare a varnish and well mixed and stirred for 1-3 hours, and the resin solubility was observed by visual inspection. If resins of the resin composition were fully dissolved, a designation of "OK" is given; if resins of the resin composition were not fully dissolved, a designation of "NG" is given. Low or insufficient resin solubility will result in poor properties of laminates and circuit boards made therefrom.

Prepreg Shelf Life

The prepreg prepared from the resin composition of each Example or each Comparative Example was rubbed with hands to obtain resin powder, which was then passed through a 60-mesh screen to obtain the sample powder. 0.15 g of the sample powder was poured on the heating plate of a cone and plate viscometer (temperature set as 175° C. and rotational speed set as 11.7 rpm) for testing, and the minimum viscosity was recorded. The viscosity values measured from each prepreg placed at 30° C. for one day and for thirty days were respectively recorded as V1 and V30 to calculate the viscosity variation ratio, which is equal to ((V30−V1)/V1)*100%. If a prepreg has a higher viscosity variation ratio, the prepreg will have shorter shelf life and may be deteriorated more easily, resulting in poor yield in the subsequent circuit board processes.

Prepreg Stickiness Resistance

The prepreg obtained from a 2116 L-glass fiber fabric impregnated with each Example or Comparative Example was prepared, and a plurality of prepregs from the same Example or Comparative Example were placed into and vacuum-packed by an aluminium foil bag. Then the bag was placed at 35° C. for 24 hours, and then the prepregs were removed from the bag for inspection to determine whether surface stickiness occurs between adjacent prepregs. If stickiness was not observed, a designation of "OK" is given; if stickiness was observed, a designation of "NG" is given. Prepreg stickiness will lower the yield in the subsequent laminate or circuit board processes.

Amount of Void after Lamination

A 2.5 mil copper-containing laminate was subject to a conventional brown oxidation process to make a brown oxide treated wiring laminate as the inner layer used to evaluate the capability of resin flowing to and filling the open area between traces during prepreg lamination. The varnish of the resin composition from each Example or each Comparative Example was used to impregnate a 1027 E-glass fiber fabric and then heated at 140° C. for 4 minutes to obtain a prepreg with a resin content of about 71%-73%. The 2.5 mil brown oxide treated wiring laminate was covered on both sides with the aforesaid prepreg (obtained by impregnating a 1027 E-glass fiber fabric with the resin composition from each Example or each Comparative Example), and then the outermost layers were respectively covered with a 18 μm HVLP (hyper very low profile) copper foil. Lamination was performed for 2 hours by using a vacuum laminator at 450 psi and 200° C. to form an inner layer wiring laminate with surface copper, and then the outermost copper foils were removed by etching to obtained an inner layer wiring laminate without surface copper. The copper-free surface of the inner layer wiring laminate without surface copper was examined with naked eyes to determine whether void exists and calculate the amount of void. The presence of void in the laminate after lamination will result in unacceptable defective circuit boards.

Multi-Layer Board Thermal Resistance

A core was prepared as follows: a prepreg (resin content of about 55%) prepared from each Example or each Comparative Example impregnated with a 2116 E-glass fiber fabric was superimposed on both sides with a piece of 18 μm HVLP copper foil, followed by lamination and curing for 2 hours under vacuum at high temperature (200° C.) and high pressure (420 psi) to obtain a copper-clad core. Then the copper-clad core obtained above was etched to remove the two copper foils so as to obtain a copper-free core (5 mil in thickness). Three copper-free cores were prepared as above. Next, two 18 μm HVLP copper foils and four prepregs (resin content of about 70%) obtained from 1080 E-glass fiber fabrics impregnated with each Example or Comparative Example were prepared and stacked in the order of one copper foil, two prepregs (obtained from 1080 E-glass fiber fabrics), one copper-free core, two prepregs (obtained from 1080 E-glass fiber fabrics), one copper-free core, two prepregs (obtained from 1080 E-glass fiber fabrics), one copper-free core, two prepregs (obtained from 1080 E-glass fiber fabrics), and one copper foil, followed by lamination under vacuum at 420 psi and 200° C. for 2 hours to form an eight-layer copper-clad laminate.

In the multi-layer board thermal resistance test, the eight-layer copper-clad laminate was used as the sample and, by reference to the processes described in IPC-TM-650 2.4.13.1, horizontally placed and floated on the solder bath of a 288° C. solder pot; the sample was removed from the solder bath after 10 seconds and inspected to determine whether delamination occurred and then reversed to place the opposite surface of the sample on the solder bath for another 10 seconds and then inspected; the processes were repeated for 10 cycles; if delamination did not occur after every cycle, a designation "O" was given to indicate absence of delamination; if delamination occurred after any cycle, a designation "X" was given to indicate presence of delamination. Three samples were tested for each Example or Comparative Example group. In the test results, a designation with one "X" represents that delamination occurs in one sample, a designation with two "X" represents that delamination occurs in two samples, and a designation with three "X" represents that delamination occurs in all three samples. For example, inter-layer separation between insulation layers is considered as delamination. Interlayer delamination or blistering may occur between any layers of the laminate.

Glass Transition Temperature (Tg)

The copper-free laminate (obtained by laminating five prepregs) was subject to glass transition temperature measurement. The glass transition temperature (in ° C.) of each sample was measured using a dynamic mechanical analysis (DMA) method by reference to IPC-TM-650 2.4.24.4 at a temperature range of 35–270° C. with a temperature increase rate of 2° C./minute. Higher glass transition temperature is better.

Ratio of Thermal Expansion

The copper-free laminate (obtained by laminating five prepregs) sample was subject to thermal mechanical analysis (TMA) during the ratio of thermal expansion (Z-axis) measurement. Each sample was heated from 35° C. to 270° C. at a temperature increase rate of 10° C./minute and then subject to the measurement of ratio of thermal expansion (%) in Z-axis from 50° C. to 260° C. by reference to the processes described in IPC-TM-650 2.4.24.5. Lower ratio of thermal expansion is better. Generally, a difference in ratio of thermal expansion of greater than or equal to 0.1% represents a significant difference.

Copper Foil Peeling Strength (a.k.a. Peeling Strength, P/S)

The aforesaid copper-clad laminate (obtained by laminating five prepregs) was cut into a rectangular sample with a width of 24 mm and a length of greater than 60 mm, which was etched to remove surface copper foil to leave a rectangular copper foil with a width of 3.18 mm and a length of greater than 60 mm, and tested by using a tensile strength tester by reference to IPC-TM-650 2.4.8 at room temperature (about 25° C.) to measure the force (lb/in) required to separate the copper foil from the insulation layer of the laminate. In the technical field to which the present disclosure pertains, higher copper foil peeling strength is better. For a copper-clad laminate with a dissipation factor of less than 0.0040 under a 10 GHz frequency, a difference in copper foil peeling strength of greater than 0.1 lb/in represents a significant difference.

Dissipation Factor (Df)

The aforesaid copper-free laminate (obtained by laminating two prepregs) was subject to dissipation factor measurement. Each sample was measured by using a microwave dielectrometer (available from AET Corp.) by reference to JIS C2565 at room temperature (about 25° C.) and under a 10 GHz frequency. Lower dissipation factor represents better dielectric properties of the sample. Under a 10 GHz frequency, for a Df value of less than 0.0040, a difference in Df of less than 0.0001 represents no substantial difference (i.e., no significant technical difficulty) in dissipation factor in different laminates, and a difference in Df of greater than 0.0001 represents a significant difference in dissipation factor in different laminates.

Compositions and test results of resin compositions of Examples and Comparative Examples are listed below (in part by weight):

TABLE 1

Resin compositions of Examples (in part by weight) and test results

| Component | | E1 | E2 | E3 | E4 | E5 | E6 |
|---|---|---|---|---|---|---|---|
| vinylbenzyl-terminated polyphenylene ether | OPE-2st 1200 | | | | | | |
| | OPE-2st 2200 | 50 | 50 | 50 | 20 | 150 | 50 |
| methacrylate-terminated polyphenylene ether | SA-9000 | | | | | | |
| maleimide resin of Formula (1) | BMI-70 | 25 | 25 | 25 | 25 | 25 | 5 |
| | Compound E | | | | | | |
| compound of Formula (2) | Compound A | 0.5 | 0.001 | 2 | 0.5 | 0.5 | 0.5 |
| | Compound B | | | | | | |
| compound of Formula (3) | Compound C | | | | | | |
| | Compound D | | | | | | |
| 4-t-butylcatechol | | | | | | | |
| 1,4-benzoquinone | | | | | | | |
| 1,1-diphenyl-2-picrylhydrazyl radical | | | | | | | |
| epoxy-terminated polyphenylene ether | OPE-2Gly | | | | | | |
| bifunctional hydroxyl-terminated polyphenylene ether | SA-90 | | | | | | |
| mono-functional hydroxyl-terminated polyphenylene ether | SA-120 | | | | | | |
| other maleimide resin | BMI-1000 | | | | | | |
| | BMI-3000 | | | | | | |
| | BMI-7000 | | | | | | |
| polyolefin | Ricon 100 | 15 | 15 | 15 | 15 | 15 | 15 |
| inorganic filler | SC-2500-SVJ | 60 | 60 | 60 | 60 | 60 | 60 |
| curing initiator | DCP | 0.5 | 0.5 | 0.5 | 0.5 | 0.5 | 0.5 |
| solvent | toluene/MEK = 1/4 | PA | PA | PA | PA | PA | PA |

| Property | Unit | E1 | E2 | E3 | E4 | E5 | E6 |
|---|---|---|---|---|---|---|---|
| resin solubility | none | OK | OK | OK | OK | OK | OK |
| prepreg shelf life | % | 4.50% | 9.50% | 1.20% | 2.50% | 7.50% | 5.20% |
| prepreg stickiness resistance | none | OK | OK | OK | OK | OK | OK |
| Amount of void after lamination | none | none | none | none | none | none | none |
| multi-layer board thermal resistance | none | OOO | OOO | OOO | OOO | OOO | OOO |
| Tg (DMA) | °C. | 249 | 248 | 246 | 253 | 238 | 233 |
| ratio of thermal expansion | % | 1.6 | 1.6 | 1.6 | 1.4 | 1.7 | 1.8 |
| copper foil peeling strength | lb/in | 4.2 | 4.2 | 4.2 | 4.1 | 4.3 | 4.2 |
| dissipation factor | none | 0.0036 | 0.0036 | 0.0036 | 0.0038 | 0.0034 | 0.0033 |

As used herein, "PA" represents "proper amount".

TABLE 2

Resin compositions of Examples (in part by weight) and test results

| Component | | E7 | E8 | E9 | E10 | E11 | E12 |
|---|---|---|---|---|---|---|---|
| vinylbenzyl-terminated polyphenylene ether | OPE-2st 1200 | | | | | | |
| | OPE-2st 2200 | 50 | 50 | 50 | 50 | 50 | 50 |
| methacrylate-terminated polyphenylene ether | SA-9000 | | | | | | |
| maleimide resin of Formula (1) | BMI-70 | 40 | 12.5 | 25 | 25 | 25 | 25 |
| | Compound E | | 12.5 | | | | |
| compound of Formula (2) | Compound A | 0.5 | 0.5 | | | | 0.2 |
| | Compound B | | | 0.5 | | | 0.1 |
| compound of Formula (3) | Compound C | | | | 0.5 | | 0.1 |
| | Compound D | | | | | 0.5 | 0.1 |
| 4-t-butylcatechol | | | | | | | |
| 1,4-benzoquinone | | | | | | | |
| 1,1-diphenyl-2-picrylhydrazyl radical | | | | | | | |
| epoxy-terminated polyphenylene ether | OPE-2Gly | | | | | | |
| bifunctional hydroxyl-terminated polyphenylene ether | SA-90 | | | | | | |

TABLE 2-continued

Resin compositions of Examples (in part by weight) and test results

| | | | | | | | |
|---|---|---|---|---|---|---|---|
| mono-functional hydroxyl-terminated polyphenylene ether | SA-120 | | | | | | |
| other maleimide resin | BMI-1000 | | | | | | |
| | BMI-3000 | | | | | | |
| | BMI-7000 | | | | | | |
| polyolefin | Ricon 100 | 15 | 15 | 15 | 15 | 15 | 15 |
| inorganic filler | SC-2500-SVJ | 60 | 60 | 60 | 60 | 60 | 60 |
| curing initiator | DCP | 0.5 | 0.5 | 0.5 | 0.5 | 0.5 | 0.5 |
| solvent | toluene/MEK = 1/4 | PA | PA | PA | PA | PA | PA |

| Property | Unit | E7 | E8 | E9 | E10 | E11 | E12 |
|---|---|---|---|---|---|---|---|
| resin solubility | none | OK | OK | OK | OK | OK | OK |
| prepreg shelf life | % | 3.70% | 4.10% | 3.60% | 6.20% | 6.80% | 5.90% |
| prepreg stickiness resistance | none | OK | OK | OK | OK | OK | OK |
| Amount of void after lamination | none | none | none | none | none | none | none |
| multi-layer board thermal resistance | none | OOO | OOO | OOO | OOO | OOO | OOO |
| Tg (DMA) | °C. | 263 | 243 | 251 | 249 | 248 | 250 |
| ratio of thermal expansion | % | 1.3 | 1.6 | 1.6 | 1.7 | 1.6 | 1.6 |
| copper foil peeling strength | lb/in | 4.0 | 4.1 | 4.1 | 4.1 | 4.2 | 4.3 |
| dissipation factor | none | 0.0038 | 0.0035 | 0.0037 | 0.0037 | 0.0037 | 0.0036 |

TABLE 3

Resin compositions of Examples (in part by weight) and test results

| Component | | E13 | E14 | E15 | E16 | E17 |
|---|---|---|---|---|---|---|
| vinylbenzyl-terminated polyphenylene ether | OPE-2st 1200 | 25 | | 30 | | |
| | OPE-2st 2200 | 25 | 30 | 10 | 50 | |
| methacrylate-terminated polyphenylene ether | SA-9000 | | 20 | 10 | | 50 |
| maleimide resin of Formula (1) | BMI-70 | 25 | 25 | 25 | 25 | 25 |
| | Compound E | | | | | |
| compound of Formula (2) | Compound A | 0.5 | 0.5 | 0.5 | 5 | 0.5 |
| | Compound B | | | | | |
| compound of Formula (3) | Compound C | | | | | |
| | Compound D | | | | | |
| 4-t-butylcatechol | | | | | | |
| 1,4-benzoquinone | | | | | | |
| 1,1-diphenyl-2-picrylhydrazyl radical | | | | | | |
| epoxy-terminated polyphenylene ether | OPE-2Gly | | | | | |
| bifunctional hydroxyl-terminated polyphenylene ether | SA-90 | | | | | |
| mono-functional hydroxyl-terminated polyphenylene ether | SA-120 | | | | | |
| other maleimide resin | BMI-1000 | | | | | |
| | BMI-3000 | | | | | |
| | BMI-7000 | | | | | |
| polyolefin | Ricon 100 | 15 | 15 | 20 | 15 | 15 |
| inorganic filler | SC-2500-SVJ | 60 | 60 | 80 | 60 | 60 |
| curing initiator | DCP | 0.5 | 0.5 | 0.3 | 0.5 | 0.5 |
| solvent | toluene/MEK = 1/4 | PA | PA | PA | PA | PA |

| Property | Unit | E13 | E14 | E15 | E16 | E17 |
|---|---|---|---|---|---|---|
| resin solubility | none | OK | OK | OK | OK | OK |
| prepreg shelf life | % | 4.60% | 3.90% | 2.80% | 1.10% | 3.80% |
| prepreg stickiness resistance | none | OK | OK | OK | OK | OK |
| Amount of void after lamination | none | none | none | none | none | none |
| multi-layer board thermal resistance | none | OOO | OOO | OOO | OOO | OOO |

TABLE 3-continued

Resin compositions of Examples (in part by weight) and test results

| | | | | | | |
|---|---|---|---|---|---|---|
| Tg (DMA) | ° C. | 260 | 238 | 265 | 240 | 240 |
| ratio of thermal expansion | % | 1.3 | 1.7 | 1.2 | 1.7 | 2.0 |
| copper foil peeling strength | lb/in | 4.3 | 4.3 | 4.6 | 3.7 | 4.6 |
| dissipation factor | none | 0.0036 | 0.0035 | 0.0035 | 0.0038 | 0.0038 |

TABLE 4

Resin compositions of Comparative Examples (in part by weight) and test results

| Component | | C1 | C2 | C3 | C4 | C5 | C6 |
|---|---|---|---|---|---|---|---|
| vinylbenzyl-terminated polyphenylene ether | OPE-2st 1200 | | | | | | |
| | OPE-2st 2200 | 50 | 30 | 50 | 50 | 50 | |
| methacrylate-terminated polyphenylene ether | SA-9000 | | 20 | | | | |
| maleimide resin of Formula (1) | BMI-70 | 25 | 25 | 25 | 25 | 25 | 25 |
| | Compound E | | | | | | |
| compound of Formula (2) | Compound A | | | | | | 0.5 |
| | Compound B | | | | | | |
| compound of Formula (3) | Compound C | | | | | | |
| | Compound D | | | | | | |
| 4-t-butylcatechol | | | | 0.5 | | | |
| 1,4-benzoquinone | | | | | 0.5 | | |
| 1,1-diphenyl-2-picrylhydrazyl radical | | | | | | 0.5 | |
| epoxy-terminated polyphenylene ether | OPE-2Gly | | | | | | 50 |
| bifunctional hydroxyl-terminated polyphenylene ether | SA-90 | | | | | | |
| mono-functional hydroxyl-terminated polyphenylene ether | SA-120 | | | | | | |
| other maleimide resin | BMI-1000 | | | | | | |
| | BMI-3000 | | | | | | |
| | BMI-7000 | | | | | | |
| polyolefin | Ricon 100 | 15 | 15 | 15 | 15 | 15 | 15 |
| inorganic filler | SC-2500-SVJ | 60 | 60 | 60 | 60 | 60 | 60 |
| curing initiator | DCP | 0.5 | 0.5 | 0.5 | 0.5 | 0.5 | 0.5 |
| solvent | toluene/MEK = 1/4 | PA | PA | PA | PA | PA | PA |

| Property | Unit | C1 | C2 | C3 | C4 | C5 | C6 |
|---|---|---|---|---|---|---|---|
| resin solubility | none | OK | OK | OK | OK | OK | OK |
| prepreg shelf life | % | 26.80% | 29.50% | 7.50% | 3.50% | 8.90% | 1.00% |
| prepreg stickiness resistance | none | NG | NG | OK | OK | OK | OK |
| Amount of void after lamination | none | >30 | >30 | 12 | 10 | 21 | 10 |
| multi-layer board thermal resistance | none | XXX | XXX | OOX | OOX | OXX | XXX |
| Tg (DMA) | ° C. | 246 | 257 | 225 | 228 | 223 | 210 |
| ratio of thermal expansion | % | 1.7 | 1.3 | 2.2 | 2.2 | 2.3 | 2.8 |
| copper foil peeling strength | lb/in | 4.1 | 4.2 | 3.2 | 3.2 | 3.3 | 3.6 |
| dissipation factor | none | 0.0037 | 0.0038 | 0.0040 | 0.0040 | 0.0041 | 0.0076 |

TABLE 5

Resin compositions of Comparative Examples (in part by weight) and test results

| Component | | C7 | C8 | C9 | C10 | C11 |
|---|---|---|---|---|---|---|
| vinylbenzyl-terminated polyphenylene ether | OPE-2st 1200 | | | | | |
| | OPE-2st 2200 | | | 50 | 50 | 50 |
| methacrylate-terminated polyphenylene ether | SA-9000 | | | | | |

TABLE 5-continued

Resin compositions of Comparative Examples (in part by weight) and test results

| | | | | | | |
|---|---|---|---|---|---|---|
| maleimide resin of Formula (1) | BMI-70 | 25 | 25 | | | |
| | Compound E | | | | | |
| compound of Formula (2) | Compound A | 0.5 | 0.5 | 0.5 | 0.5 | 0.5 |
| | Compound B | | | | | |
| compound of Formula (3) | Compound C | | | | | |
| | Compound D | | | | | |
| 4-t-butylcatechol | | | | | | |
| 1,4-benzoquinone | | | | | | |
| 1,1-diphenyl-2-picrylhydrazyl radical | | | | | | |
| epoxy-terminated polyphenylene ether | OPE-2Gly | | | | | |
| bifunctional hydroxyl-terminated polyphenylene ether | SA-90 | 50 | | | | |
| mono-functional hydroxyl-terminated polyphenylene ether | SA-120 | | 50 | | | |
| other maleimide resin | BMI-1000 | | | 25 | | |
| | BMI-3000 | | | | 25 | |
| | BMI-7000 | | | | | 25 |
| polyolefin | Ricon 100 | 15 | 15 | 15 | 15 | 15 |
| inorganic filler | SC-2500-SVJ | 60 | 60 | 60 | 60 | 60 |
| curing initiator | DCP | 0.5 | 0.5 | 0.5 | 0.5 | 0.5 |
| solvent | toluene/MEK = 1/4 | PA | PA | PA | PA | PA |

| Property | Unit | C7 | C8 | C9 | C10 | C11 |
|---|---|---|---|---|---|---|
| resin solubility | none | OK | OK | NG | NG | NG |
| prepreg shelf life | % | 4.50% | 4.50% | 3.90% | 6.90% | 5.20% |
| prepreg stickiness resistance | none | OK | OK | NG | NG | NG |
| Amount of void after lamination | none | >30 | >30 | >30 | >30 | >30 |
| multi-layer board thermal resistance | none | XXX | XXX | XXX | XXX | XXX |
| Tg (DMA) | ° C. | 218 | 215 | 233 | 238 | 235 |
| ratio of thermal expansion | % | 2.5 | 2.6 | 2.1 | 2.1 | 2.1 |
| copper foil peeling strength | lb/in | 4.3 | 4.2 | 3.5 | 3.4 | 3.4 |
| dissipation factor | none | 0.0071 | 0.0071 | 0.0044 | 0.0047 | 0.0046 |

The following observations can be made according to the test results above.

Comparison of Examples E1 to E17 and Comparative Examples C1 to C2 indicates that if the resin composition does not contain the compound of Formula (2) or Formula (3), several disadvantages will be observed, including poor prepreg shelf life, poor prepreg stickiness resistance, presence of voids after lamination and delamination in the multi-layer board thermal resistance test.

Comparison of Examples E1 to E17 and Comparative Examples C3 to C5 indicates that if the resin composition does not contain the compound of Formula (2) or Formula (3) but contains such as 4-t-butylcatechol, 1,4-benzoquinone or 1,1-diphenyl-2-picrylhydrazyl radical, several disadvantages will be observed, including presence of voids after lamination, delamination in the multi-layer board thermal resistance test, significantly lowered glass transition temperature, significantly increased ratio of thermal expansion, lowered copper foil peeling strength and increased dissipation factor.

Comparison of Examples E1 to E17 and Comparative Examples C6 to C8 indicates that if the resin composition contains a polyphenylene ether different from the unsaturated bond-containing polyphenylene ether resin defined above, several disadvantages will be observed, including presence of voids after lamination, delamination in the multi-layer board thermal resistance test, significantly lowered glass transition temperature, significantly increased ratio of thermal expansion and significantly increased dissipation factor.

Comparison of Examples E1 to E17 and Comparative Examples C9 to C11 indicates that if the resin composition contains a maleimide resin different from the maleimide resin of Formula (1) defined above, several disadvantages will be observed, including poor resin solubility, poor prepreg stickiness resistance, presence of voids after lamination, delamination in the multi-layer board thermal resistance test, lowered copper foil peeling strength and increased dissipation factor.

The above detailed description is merely illustrative in nature and is not intended to limit the embodiments of the subject matter or the application and use of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A resin composition, comprising:
   20 to 150 parts by weight of an unsaturated bond-containing polyphenylene ether resin;
   5 to 40 parts by weight of a maleimide resin of Formula (1); and
   0.001 to 5 parts by weight of a compound of Formula (2) or Formula (3);

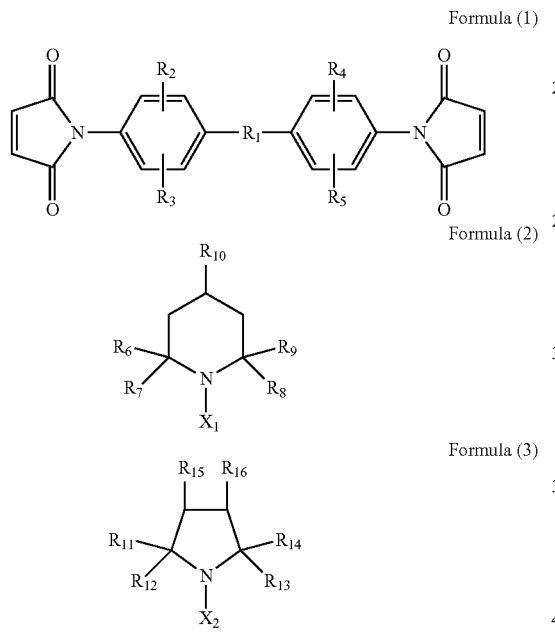

wherein:
in Formula (1), $R_1$ is a covalent bond, —$CH_2$—, —CH($CH_3$)—, —C($CH_3$)$_2$—, —O—, —S—, —$SO_2$— or a carbonyl group, $R_2$ to $R_5$ each independently represents a hydrogen atom or a $C_1$-$C_5$ alkyl group, and $R_2$ to $R_5$ are not a hydrogen atom at the same time;
in Formula (2), $X_1$ is an oxygen radical or a hydroxyl group, $R_6$ to $R_9$ each independently represents a hydrogen atom or a $C_1$-$C_5$ alkyl group, $R_6$ to $R_9$ are not a hydrogen atom at the same time, and $R_{10}$ is a hydrogen atom, a methyl group, an amino group, a hydroxyl group, a carbonyl group or a carboxyl group; and
in Formula (3), $X_2$ is an oxygen radical or a hydroxyl group, $R_{11}$ to $R_{14}$ each independently represents a hydrogen atom or a $C_1$-$C_5$ alkyl group, $R_{11}$ to $R_{14}$ are not a hydrogen atom at the same time, and $R_{15}$ and $R_{16}$ each independently represents a hydrogen atom, a methyl group, an amino group, a hydroxyl group, a carbonyl group or a carboxyl group or $R_{15}$ and $R_{16}$ together define a benzene ring structure.

2. The resin composition of claim 1, wherein the unsaturated bond-containing polyphenylene ether resin comprises a vinylbenzyl-containing polyphenylene ether resin, a methacrylate-containing polyphenylene ether resin, an allyl-containing polyphenylene ether resin, a vinylbenzyl-modified bisphenol A polyphenylene ether resin, a chain-extended vinyl-containing polyphenylene ether resin or a combination thereof.

3. The resin composition of claim 1, wherein the maleimide resin of Formula (1) comprises a monomer of any one of Formula (4) to Formula (8), a polymer thereof or a combination thereof:

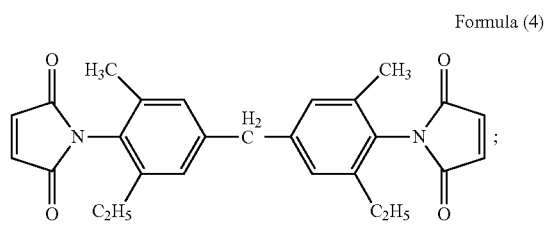

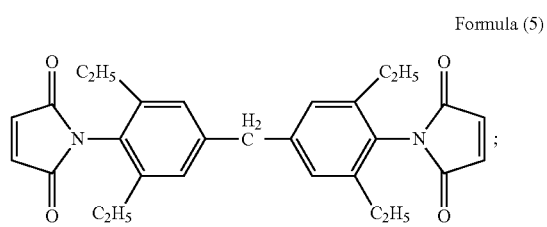

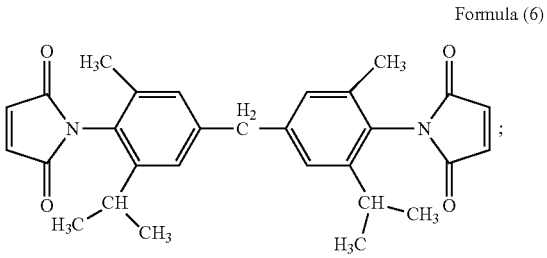

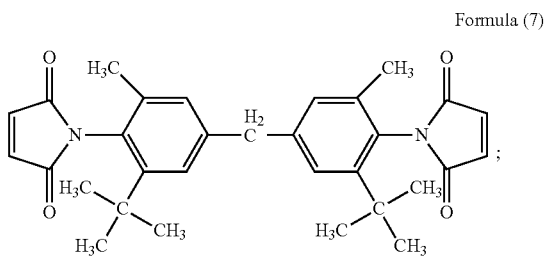

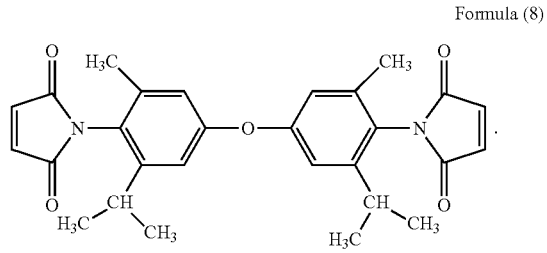

4. The resin composition of claim 1, wherein the compound of Formula (2) comprises a compound of any one of Formula (9) to Formula (13) or a combination thereof:

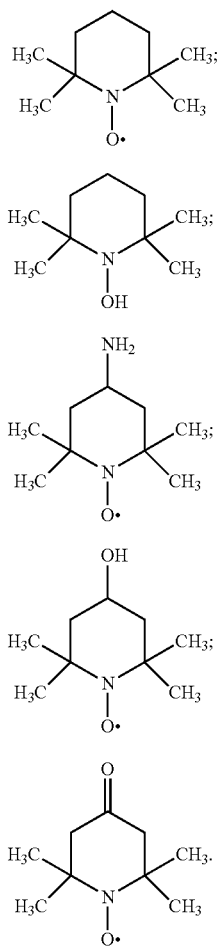

5. The resin composition of claim 1, wherein the compound of Formula (3) comprises a compound of any one of Formula (14) to Formula (17) or a combination thereof:

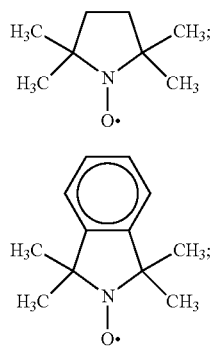

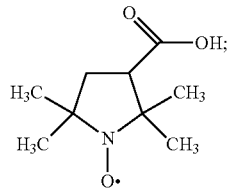

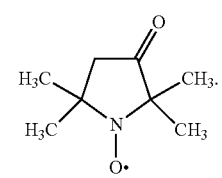

6. The resin composition of claim 1, further comprising: an epoxy resin, a cyanate ester resin, a small molecule vinyl compound, an acrylate, a phenolic resin, a benzoxazine resin, a styrene maleic anhydride, a polyolefin, a polyester resin, an amine curing agent, a polyamide resin, a polyimide resin or a combination thereof.

7. The resin composition of claim 1, further comprising: flame retardant, inorganic filler, curing accelerator, solvent, silane coupling agent, coloring agent, toughening agent or a combination thereof.

8. An article made from the resin composition of claim 1, comprising a prepreg, a resin film, a laminate or a printed circuit board.

9. The article of claim 8, having a prepreg viscosity variation ratio of less than or equal to 10%.

10. The article of claim 8, being absent of stickiness between two adjacent prepreg surfaces.

11. The article of claim 8, being absent of void after lamination.

12. The article of claim 8, wherein no delamination occurs after subjecting the article to a multi-layer board thermal resistance test by reference to IPC-TM-650 2.4.13.1.

13. The article of claim 8, having a glass transition temperature as measured by reference to IPC-TM-650 2.4.24.4 of greater than or equal to 230° C.

14. The article of claim 8, having a ratio of thermal expansion as measured by reference to IPC-TM-650 2.4.24.5 of less than or equal to 2.0%.

15. The article of claim 8, having a copper foil peeling strength as measured by reference to IPC-TM-650 2.4.8 of greater than or equal to 3.7 lb/in.

16. The article of claim 8, having a dissipation factor at 10 GHz as measured by reference to JIS C2565 of less than or equal to 0.0038.

* * * * *